United States Patent
Brown

(10) Patent No.: US 12,224,186 B2
(45) Date of Patent: Feb. 11, 2025

(54) APPARATUS AND METHOD OF BRUSH CLEANING USING PERIODIC CHEMICAL TREATMENTS

(71) Applicant: Applied Materials, Inc., Santa Clara, CA (US)

(72) Inventor: Brian J. Brown, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/130,407

(22) Filed: Apr. 3, 2023

(65) Prior Publication Data

US 2024/0332037 A1   Oct. 3, 2024

(51) Int. Cl.
| | | |
|---|---|---|
| H01L 21/67 | (2006.01) |
| B08B 1/12 | (2024.01) |
| B08B 1/32 | (2024.01) |
| B08B 1/50 | (2024.01) |
| B08B 3/02 | (2006.01) |
| B08B 3/08 | (2006.01) |

(Continued)

(52) U.S. Cl.
CPC .......... *H01L 21/67046* (2013.01); *B08B 1/12* (2024.01); *B08B 1/32* (2024.01); *B08B 1/50* (2024.01); *B08B 3/02* (2013.01); *B08B 3/08* (2013.01); *B24B 53/017* (2013.01); *H01L 21/02096* (2013.01)

(58) Field of Classification Search
None
See application file for complete search history.

(56) References Cited

U.S. PATENT DOCUMENTS

| | | |
|---|---|---|
| 2,998,680 A | 9/1961 | Lipkins |
| 3,518,798 A | 7/1970 | Boettcher |
| 3,659,386 A | 5/1972 | Goetz et al. |

(Continued)

FOREIGN PATENT DOCUMENTS

| | | |
|---|---|---|
| CN | 104303272 A | 1/2015 |
| CN | 102725830 B | 3/2016 |

(Continued)

OTHER PUBLICATIONS

Google Patents translation of KR20100060676A (Year: 2024).*
International Search Report/ Written Opinion issued to PCT/US2024/014129 on Jun. 10, 2024, 9 pages.

*Primary Examiner* — Eric W Golightly
(74) *Attorney, Agent, or Firm* — Patterson + Sheridan, LLP

(57) ABSTRACT

A chemical mechanical polishing (CMP) system include apparatus and methods to clean brushes used to scrub substrates, including brush cleaning using periodic chemical treatment. One or more embodiments include a method of operating the CMP system to rotate a first one or more scrubber brushes while the first one or more scrubber brushes are in contact with a first substrate, performing, concurrent with the rotating during the first time duration, a cleaning operation for a second one or more scrubber brushes, performing, during a second time duration of the cleaning cycle, the cleaning operation for the first one or more scrubber brushes, and rotating, concurrent with the performing the cleaning operation during the second time duration, the second one or more scrubber brushes while the second one or more scrubber brushes are in contact with a second substrate.

11 Claims, 10 Drawing Sheets

(51) Int. Cl.
    *B24B 53/017* (2012.01)
    *H01L 21/02* (2006.01)

(56) References Cited

U.S. PATENT DOCUMENTS

| | | | |
|---|---|---|---|
| 3,665,648 A | 5/1972 | Yamanaka |
| 3,731,435 A | 5/1973 | Boettcher et al. |
| 3,762,103 A | 10/1973 | Nielsen |
| 3,913,271 A | 10/1975 | Boettcher |
| 4,020,600 A | 5/1977 | Day |
| 4,021,278 A | 5/1977 | Hood et al. |
| 4,141,180 A | 2/1979 | Gill, Jr. et al. |
| 4,502,252 A | 3/1985 | Iwabuchi |
| 4,509,298 A | 4/1985 | Klievoneit |
| 4,583,325 A | 4/1986 | Tabuchi |
| 4,653,231 A | 3/1987 | Cronkhite et al. |
| 4,944,119 A | 7/1990 | Gill, Jr. et al. |
| 5,081,051 A | 1/1992 | Mattingly et al. |
| 5,081,795 A | 1/1992 | Tanaka et al. |
| 5,216,843 A | 6/1993 | Breivogel et al. |
| 5,224,304 A | 7/1993 | Cesna |
| 5,232,875 A | 8/1993 | Tuttle et al. |
| 5,246,525 A | 9/1993 | Sato |
| 5,317,778 A | 6/1994 | Kudo et al. |
| 5,329,732 A | 7/1994 | Karlsrud et al. |
| 5,361,545 A | 11/1994 | Nakamura |
| 5,421,768 A | 6/1995 | Fujiwara et al. |
| 5,443,416 A | 8/1995 | Volodarsky et al. |
| 5,456,627 A | 10/1995 | Jackson et al. |
| 5,478,435 A | 12/1995 | Murphy et al. |
| 5,486,131 A | 1/1996 | Cesna et al. |
| 5,498,199 A | 3/1996 | Karlsrud et al. |
| 5,584,647 A | 12/1996 | Uehara et al. |
| 5,649,854 A | 7/1997 | Gill, Jr. |
| 5,692,947 A | 12/1997 | Talieh et al. |
| 5,738,574 A | 4/1998 | Tolles et al. |
| 5,804,507 A | 9/1998 | Perlov et al. |
| 5,934,979 A | 8/1999 | Talieh |
| 5,938,504 A | 8/1999 | Talieh |
| 5,944,582 A | 8/1999 | Talieh |
| 6,045,716 A | 4/2000 | Walsh et al. |
| 6,080,046 A | 6/2000 | Shendon et al. |
| 6,086,457 A | 7/2000 | Perlov et al. |
| 6,095,908 A | 8/2000 | Torii |
| 6,126,517 A | 10/2000 | Tolles et al. |
| 6,155,768 A | 12/2000 | Bacchi et al. |
| 6,156,124 A | 12/2000 | Tobin |
| 6,159,080 A | 12/2000 | Talieh |
| 6,179,690 B1 | 1/2001 | Talieh |
| 6,200,199 B1 | 3/2001 | Gurusamy et al. |
| 6,220,941 B1 | 4/2001 | Fishkin et al. |
| 6,220,942 B1 | 4/2001 | Tolles et al. |
| 6,227,948 B1 | 5/2001 | Khoury et al. |
| 6,227,950 B1 | 5/2001 | Hempel et al. |
| 6,231,428 B1 | 5/2001 | Maloney et al. |
| 6,241,592 B1 | 6/2001 | Togawa et al. |
| 6,283,822 B1 | 9/2001 | Togawa et al. |
| 6,293,849 B1 | 9/2001 | Kawashima |
| 6,309,279 B1 | 10/2001 | Bowman et al. |
| 6,322,427 B1 | 11/2001 | Li et al. |
| 6,332,826 B1 | 12/2001 | Katsuoka et al. |
| 6,343,979 B1 | 2/2002 | Peltier et al. |
| 6,350,188 B1 | 2/2002 | Bartlett et al. |
| 6,354,918 B1 | 3/2002 | Togawa et al. |
| 6,354,922 B1 | 3/2002 | Sakurai et al. |
| 6,354,926 B1 | 3/2002 | Walsh |
| 6,358,126 B1 | 3/2002 | Jackson et al. |
| 6,361,648 B1 | 3/2002 | Tobin |
| 6,398,625 B1 | 6/2002 | Talieh |
| 6,402,598 B1 | 6/2002 | Ahn et al. |
| 6,409,582 B1 | 6/2002 | Togawa et al. |
| 6,413,146 B1 | 7/2002 | Katsuoka et al. |
| 6,413,356 B1 | 7/2002 | Chokshi et al. |
| 6,413,873 B1 | 7/2002 | Li et al. |
| 6,435,941 B1 | 8/2002 | White |
| 6,447,385 B1 | 9/2002 | Togawa et al. |
| 6,475,914 B2 | 11/2002 | Han |
| 6,558,471 B2 | 5/2003 | Brown et al. |
| 6,572,730 B1 | 6/2003 | Shah |
| 6,575,816 B2 | 6/2003 | Hempel et al. |
| 6,579,148 B2 | 6/2003 | Hirokawa et al. |
| 6,582,282 B2 | 6/2003 | Somekh |
| 6,586,336 B2 | 7/2003 | Jeong |
| 6,592,438 B2 | 7/2003 | Tolles et al. |
| 6,592,439 B1 | 7/2003 | Li et al. |
| 6,629,883 B2 | 10/2003 | Katsuoka et al. |
| 6,682,408 B2 | 1/2004 | Sakurai et al. |
| 6,716,086 B1 | 4/2004 | Tobin |
| 6,780,773 B2 | 8/2004 | Li et al. |
| 6,793,565 B1 | 9/2004 | Chadda et al. |
| 6,805,616 B2 | 10/2004 | Kawashima |
| 6,811,618 B2 | 11/2004 | Kuroda |
| 6,817,923 B2 | 11/2004 | Smith |
| 6,841,057 B2 | 1/2005 | Wadensweiler et al. |
| 6,842,932 B2 | 1/2005 | Ishihara |
| 6,848,976 B2 | 2/2005 | Somekh |
| 6,852,017 B2 | 2/2005 | Brown |
| 6,857,941 B2 | 2/2005 | Emami et al. |
| 6,869,345 B2 | 3/2005 | Brown |
| 6,872,129 B2 | 3/2005 | Tobin |
| 6,878,044 B2 | 4/2005 | Sakurai et al. |
| 6,916,231 B2 | 7/2005 | Wakabayashi |
| 6,918,814 B2 | 7/2005 | Katsuoka et al. |
| 6,935,934 B2 | 8/2005 | Walsh |
| 6,937,005 B2 | 8/2005 | Hofer et al. |
| 6,942,541 B2 | 9/2005 | Togawa et al. |
| 6,942,545 B2 | 9/2005 | Jeong |
| 6,949,466 B2 | 9/2005 | Jeong |
| 6,951,507 B2 | 10/2005 | Talieh |
| 6,969,305 B2 | 11/2005 | Kimura et al. |
| 6,977,036 B2 | 12/2005 | Wadensweiler et al. |
| 7,004,815 B2 | 2/2006 | Jeong |
| 7,011,569 B2 | 3/2006 | Shimizu et al. |
| 7,044,832 B2 | 5/2006 | Yilmaz et al. |
| 7,063,603 B2 | 6/2006 | Moore et al. |
| 7,066,791 B2 | 6/2006 | Brown |
| 7,070,475 B2 | 7/2006 | Manens et al. |
| 7,074,109 B1 | 7/2006 | Bennett et al. |
| 7,077,721 B2 | 7/2006 | Hu et al. |
| 7,084,064 B2 | 8/2006 | Liu et al. |
| 7,097,544 B1 | 8/2006 | Tolles et al. |
| 7,101,253 B2 | 9/2006 | Olgado |
| 7,101,255 B2 | 9/2006 | Katsuoka et al. |
| 7,104,867 B2 | 9/2006 | Jeong |
| 7,104,875 B2 | 9/2006 | Birang et al. |
| 7,166,016 B1 | 1/2007 | Chen |
| 7,198,551 B2 | 4/2007 | Talieh |
| 7,238,090 B2 | 7/2007 | Tolles et al. |
| 7,241,203 B1 | 7/2007 | Chen et al. |
| 7,255,632 B2 | 8/2007 | Tolles et al. |
| 7,273,408 B2 | 9/2007 | Chen et al. |
| 7,303,467 B2 | 12/2007 | Birang et al. |
| 7,390,744 B2 | 6/2008 | Jia et al. |
| 7,614,939 B2 | 11/2009 | Tolles et al. |
| 7,644,512 B1 | 1/2010 | Liu et al. |
| 7,651,384 B2 | 1/2010 | Golden et al. |
| 7,962,990 B2 | 6/2011 | Chen et al. |
| 8,079,894 B2 | 12/2011 | Tolles et al. |
| 8,137,162 B2 | 3/2012 | Abrahamians et al. |
| 8,172,643 B2 | 5/2012 | Yilmaz et al. |
| 8,202,140 B2 | 6/2012 | Hong et al. |
| 8,211,242 B2 | 7/2012 | Inoue et al. |
| 8,276,291 B2 | 10/2012 | Liu et al. |
| 8,308,529 B2 | 11/2012 | D'Ambra et al. |
| 8,322,963 B2 | 12/2012 | Hudgens et al. |
| 8,813,293 B2 | 8/2014 | Ko et al. |
| 8,967,935 B2 | 3/2015 | Goodman et al. |
| 8,968,055 B2 | 3/2015 | Chen et al. |
| 9,017,138 B2 | 4/2015 | Chen et al. |
| 9,227,293 B2 | 1/2016 | David et al. |
| 9,352,441 B2 | 5/2016 | Zuniga et al. |
| 9,358,662 B2 | 6/2016 | Miyazaki et al. |
| 9,421,617 B2 | 8/2016 | Goodman et al. |
| 9,434,045 B2 | 9/2016 | Yeh et al. |

(56) References Cited

U.S. PATENT DOCUMENTS

| | | |
|---|---|---|
| 9,570,311 B2 | 2/2017 | Kuo et al. |
| 9,592,585 B2 | 3/2017 | Lin et al. |
| 9,610,673 B2 | 4/2017 | Torikoshi |
| 9,687,955 B2 | 6/2017 | Watanabe et al. |
| 10,002,777 B2 | 6/2018 | Kweon et al. |
| 10,008,380 B2 | 6/2018 | Ishibashi et al. |
| 10,040,166 B2 | 8/2018 | Nabeya et al. |
| 10,090,189 B2 | 10/2018 | Ishibashi |
| 10,293,455 B2 | 5/2019 | Nabeya et al. |
| 10,478,938 B2 | 11/2019 | Torikoshi |
| 10,486,285 B2 | 11/2019 | Miyazaki et al. |
| 10,513,006 B2 | 12/2019 | Wu et al. |
| 10,518,382 B2 | 12/2019 | Kweon et al. |
| 11,289,347 B2 | 3/2022 | Rangarajan et al. |
| 11,705,354 B2 | 7/2023 | Hoey et al. |
| 11,749,552 B2 | 9/2023 | Rangarajan et al. |
| 2002/0009954 A1 | 1/2002 | Togawa et al. |
| 2002/0115392 A1 | 8/2002 | Kawashima |
| 2002/0197946 A1 | 12/2002 | Emami et al. |
| 2003/0003848 A1 | 1/2003 | Tobin |
| 2003/0017706 A1 | 1/2003 | Moore et al. |
| 2003/0022497 A1 | 1/2003 | Li et al. |
| 2003/0026683 A1 | 2/2003 | Govzman et al. |
| 2003/0202092 A1 | 10/2003 | Sadighi et al. |
| 2004/0023495 A1 | 2/2004 | Butterfield et al. |
| 2004/0053560 A1 | 3/2004 | Sun et al. |
| 2004/0053566 A1 | 3/2004 | Tolles et al. |
| 2004/0072445 A1 | 4/2004 | Sun et al. |
| 2004/0072499 A1 | 4/2004 | Wakabayashi |
| 2004/0097169 A1 | 5/2004 | Moore |
| 2004/0137823 A1 | 7/2004 | Sakurai et al. |
| 2005/0070210 A1 | 3/2005 | Jeong |
| 2005/0176349 A1 | 8/2005 | Yilmaz et al. |
| 2005/0178666 A1 | 8/2005 | Tsai et al. |
| 2005/0227586 A1 | 10/2005 | Jeong |
| 2005/0233578 A1 | 10/2005 | Jia et al. |
| 2005/0272352 A1 | 12/2005 | Polyak et al. |
| 2005/0282472 A1 | 12/2005 | Jeong |
| 2006/0003672 A1 | 1/2006 | Yoshida et al. |
| 2006/0003673 A1 | 1/2006 | Moore |
| 2006/0030156 A1 | 2/2006 | Butterfield et al. |
| 2006/0035563 A1 | 2/2006 | Kalenian et al. |
| 2006/0046623 A1 | 3/2006 | Wang et al. |
| 2006/0057812 A1 | 3/2006 | Liu et al. |
| 2006/0070872 A1 | 4/2006 | Mavliev et al. |
| 2006/0105680 A1 | 5/2006 | Jeong |
| 2006/0172671 A1 | 8/2006 | Chen et al. |
| 2006/0183407 A1 | 8/2006 | David |
| 2007/0066200 A9 | 3/2007 | Li et al. |
| 2007/0077861 A1 | 4/2007 | Chen |
| 2007/0096315 A1 | 5/2007 | Manens et al. |
| 2007/0128982 A1 | 6/2007 | Lee et al. |
| 2008/0026681 A1 | 1/2008 | Butterfield et al. |
| 2008/0035474 A1 | 2/2008 | Wang et al. |
| 2008/0038993 A1 | 2/2008 | Jeong |
| 2008/0047841 A1 | 2/2008 | Manens et al. |
| 2008/0051014 A1 | 2/2008 | Jeong et al. |
| 2008/0156657 A1 | 7/2008 | Butterfield et al. |
| 2008/0166958 A1 | 7/2008 | Golden et al. |
| 2008/0239308 A1 | 10/2008 | Ravid et al. |
| 2008/0242202 A1 | 10/2008 | Wang et al. |
| 2008/0274673 A1 | 11/2008 | Adachi |
| 2009/0068934 A1 | 3/2009 | Hong et al. |
| 2009/0196724 A1 | 8/2009 | Chen et al. |
| 2009/0270015 A1 | 10/2009 | D'Ambra et al. |
| 2009/0305612 A1 | 12/2009 | Miyazaki et al. |
| 2012/0064800 A1 | 3/2012 | Watanabe et al. |
| 2012/0135148 A1 | 5/2012 | Deguchi et al. |
| 2012/0322345 A1 | 12/2012 | Rangarajan et al. |
| 2013/0115862 A1 | 5/2013 | Rangarajan et al. |
| 2013/0199405 A1 | 8/2013 | Rangarajan et al. |
| 2013/0288578 A1 | 10/2013 | Chen et al. |
| 2014/0003890 A1 | 1/2014 | Goto |
| 2014/0213157 A1 | 7/2014 | Torikoshi |
| 2014/0220863 A1 | 8/2014 | Wu et al. |
| 2015/0044944 A1 | 2/2015 | Chen |
| 2015/0098773 A1 | 4/2015 | Rice et al. |
| 2015/0318179 A1 | 11/2015 | Yeh et al. |
| 2015/0367464 A1 | 12/2015 | Chen |
| 2016/0096211 A1 | 4/2016 | Izaki |
| 2018/0311784 A1 | 11/2018 | Trojan |
| 2021/0323117 A1 | 10/2021 | Rangarajan et al. |
| 2022/0013394 A1 | 1/2022 | Hoey et al. |
| 2022/0111485 A1 | 4/2022 | Chae et al. |
| 2022/0134505 A1 | 5/2022 | Golubovsky et al. |
| 2023/0013401 A1 | 1/2023 | Lam |
| 2023/0264319 A1 | 8/2023 | Golubovsky et al. |
| 2023/0352337 A1 | 11/2023 | Rangarajan et al. |

FOREIGN PATENT DOCUMENTS

| | | |
|---|---|---|
| CN | 103962936 B | 8/2018 |
| CN | 112570332 A | 3/2021 |
| DE | 3737904 A1 | 5/1989 |
| EP | 1738871 B1 | 2/2009 |
| JP | 2001096245 A | 4/2001 |
| JP | 2019021859 A | 2/2019 |
| KR | 20100060676 A | 6/2010 |
| KR | 101484120 B1 | 1/2015 |
| WO | 02089183 A2 | 11/2002 |
| WO | 2019089467 A1 | 5/2019 |
| WO | 2020150072 A1 | 7/2020 |

\* cited by examiner

APPARATUS AND METHOD OF BRUSH CLEANING USING PERIODIC CHEMICAL TREATMENTS

BACKGROUND

Field

Embodiments of the present disclosure generally relate to cleaning modules used to scrub substrates, and more particularly to apparatuses and methods for brush cleaning using periodic chemical treatments.

Description of the Related Art

An integrated circuit is typically formed on a substrate (e.g., a semiconductor wafer) by the sequential deposition of conductive, semiconductive, or insulative layers on the substrate, and by the subsequent processing of the layers.

One fabrication step involves depositing a filler layer over a non-planar surface disposed on the substrate and planarizing the filler layer until the non-planar surface is exposed. For example, a conductive filler layer can be deposited on a patterned insulative layer disposed on the substrate to fill the trenches or holes in the insulative layer. The filler layer is then polished until the raised pattern of the insulative layer is exposed.

Chemical mechanical polishing (CMP) is one accepted method of planarization known in the art. This planarization method typically requires that the substrate be mounted on a carrier head. The exposed surface of the substrate is placed against a rotating polishing pad. The carrier head provides a controllable load on the substrate to push it against the polishing pad. For example, the carrier head may provide a specified pressure on the backside of the substrate to push it against the polishing pad. A polishing liquid, such as a slurry with abrasive particles, is supplied to the surface of the polishing pad. For example, cerium-based slurries, such as slurries containing cerium oxide, can be used in the polishing of a semiconductor or insulating thin layer in CMP.

After polishing, slurry residue is conventionally cleaned or scrubbed from the substrate surfaces via mechanical scrubbing devices, which may employ scrubber brushes. Such brushes may be made of polyvinyl acetate (PVA), other porous or sponge-like material, or nylon bristles, etc. Scrubbing devices may remove the majority of slurry and other particulates from a substrate's surfaces when the brushes are clean, but the brushes may become loaded with residual slurry and particulates after cleaning one or more substrate, and streaks or other residue may be found on the substrate's surface after application of the mechanical scrubbing device. Accordingly, scrubber brushes need to be cleaned to remove the residual slurry and particulates to improve the effectiveness of the cleaning process.

One technique for cleaning a scrubber brush is to apply or spray a cleaning solution directly or indirectly onto the brush during while the mechanical scrubbing device is applied to the substrate. In such case, the chemistry of the cleaning fluid should be compatible with the substrate, include any features, devices, components, layers, etc., formed on or in the substrate. However, cleaning the scrubbing brush using compatible cleaning fluids may be slow, unsatisfactorily effective, or both.

Another technique may include using a cleaning fluid that is more effective to clean the scrubber brushes, but that has a chemistry that is incompatible with the substrate. In that case, cleaning of substrates may be paused temporarily so that the cleaning fluid may be applied to the scrubber brushes in the absence of substrates. After cleaning of the scrubber brushes, cleaning of substrates may resume. While this technique more effectively cleans the scrubber brushes, substrate throughput will be reduced because the overall substrate cleaning sequence will be slowed due to the required temporary pause to clean the scrubber brushes.

Accordingly, there is a need in the art for improved apparatus and methods for cleaning brushes used in chemical mechanical polishing.

SUMMARY

Embodiments described herein generally relate cleaning brushes used to scrub the surface of a substrate. More particularly, embodiments described herein provide apparatuses and methods for brush cleaning using periodic chemical treatments.

One or more embodiments include a method of operating a chemical mechanical polishing (CMP) system. The method includes rotating, in a first brush cleaner of the CMP system during a first time duration of a cleaning cycle, a first one or more scrubber brushes while the first one or more scrubber brushes are in contact with a first substrate. The method further includes performing, concurrent with the rotating during the first time duration, a cleaning operation for a second one or more scrubber brushes in a second brush cleaner of the CMP system. The method further includes performing, during a second time duration of the cleaning cycle, the cleaning operation for the first one or more scrubber brushes in the first brush cleaner. The method further includes rotating, concurrent with the performing the cleaning operation during the second time duration, the second one or more scrubber brushes while the second one or more scrubber brushes are in contact with a second substrate.

In one or more embodiments, a CMP system includes a first brush cleaner containing a first one or more scrubber brushes, a second brush cleaner containing a second one or more scrubber brushes, and a system controller. The system controller is configured to simultaneously control the first brush cleaner and the second brush cleaner to rotate the first one or more scrubber brushes while the first one or more scrubber brushes are in contact with a first substrate. The system controller is further configured to simultaneously control the first brush cleaner and the second brush cleaner to perform, concurrent with the rotating during the first time duration, a cleaning operation for the second one or more scrubber brushes. The system controller is further configured to simultaneously control the first brush cleaner and the second brush cleaner to perform, during a second time duration of the cleaning cycle, the cleaning operation for the first one or more scrubber brushes. The system controller is further configured to simultaneously control the first brush cleaner and the second brush cleaner to rotate, concurrent with the performing the cleaning operation during the second time duration, the second one or more scrubber brushes while the second one or more scrubber brushes are in contact with a second substrate.

In one or more embodiments, a CMP system includes a first brush cleaner containing a first one or more scrubber brushes, a second brush cleaner containing a second one or more scrubber brushes, and a computer readable medium storing instructions. The instructions, when executed by a processor of the CMP system, cause the CMP system to rotate the first one or more scrubber brushes while the first one or more scrubber brushes are in contact with a first substrate. The instructions further cause the CMP system to perform, concurrent with the rotating during the first time duration, a cleaning operation for the second one or more scrubber brushes. The instructions further cause the CMP system to perform, during a second time duration of the cleaning cycle, the cleaning operation for the first one or more scrubber brushes. The instructions further cause the CMP system to rotate, concurrent with the performing the cleaning operation during the second time duration, the second one or more scrubber brushes while the second one or more scrubber brushes are in contact with a second substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of the scope of the disclosure, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure provided herein generally relate to cleaning brushes used to scrub substrates, for example following a chemical mechanical polishing (CMP) process. More particularly, embodiments described herein provide apparatuses and methods for brush cleaning substrates that are provided in a cleaning sequence, during which periodic chemical treatments of the brush cleaning apparatus is performed. During a CMP process, a film being polished may be redeposited on the surface of the substrate (e.g., a wafer) and polishing process components (e.g., abrasive particles or polishing pad, carrier ring or conditioning disk debris) may form of a residue on the surface of the substrate. When brushes of a brush cleaner are applied to the substrate to remove the film during a substrate cleaning operating, debris from the film and leftover slurry components may accumulate on the brushes. A cleaning solution may be applied to the brushes to remove residue from the brushes. However, such cleaning solutions may also etch the film from the substrate.

In one or more embodiment as described herein, brushes of a brush cleaner may be periodically cleaned in the absence of the substrate. In one or more embodiments, two or more brush cleaners are used in the CMP system so that during a given time duration, brushes of a first, idle brush cleaner may be cleaned while a second brush cleaner loaded with a substrate may operate the brushes to clean the substrate. One or more embodiments include a cleaning pattern whereby two or more brush cleaners may alternate time durations used for cleaning the brushes of the brush cleaner, and performing a substrate cleaning operation using the brush cleaner. By alternating, the brush cleaners may be efficiently used to increase substrate cleaning throughput using the brush cleaners, and provide for cleaned brushes to be applied to the substrate by the brush cleaners during the substrate cleaning operation, improving the cleanliness of the substrates and maintaining or improving substrate cleaning throughput.

Exemplary Chemical Mechanical Polishing System

Figure 1:
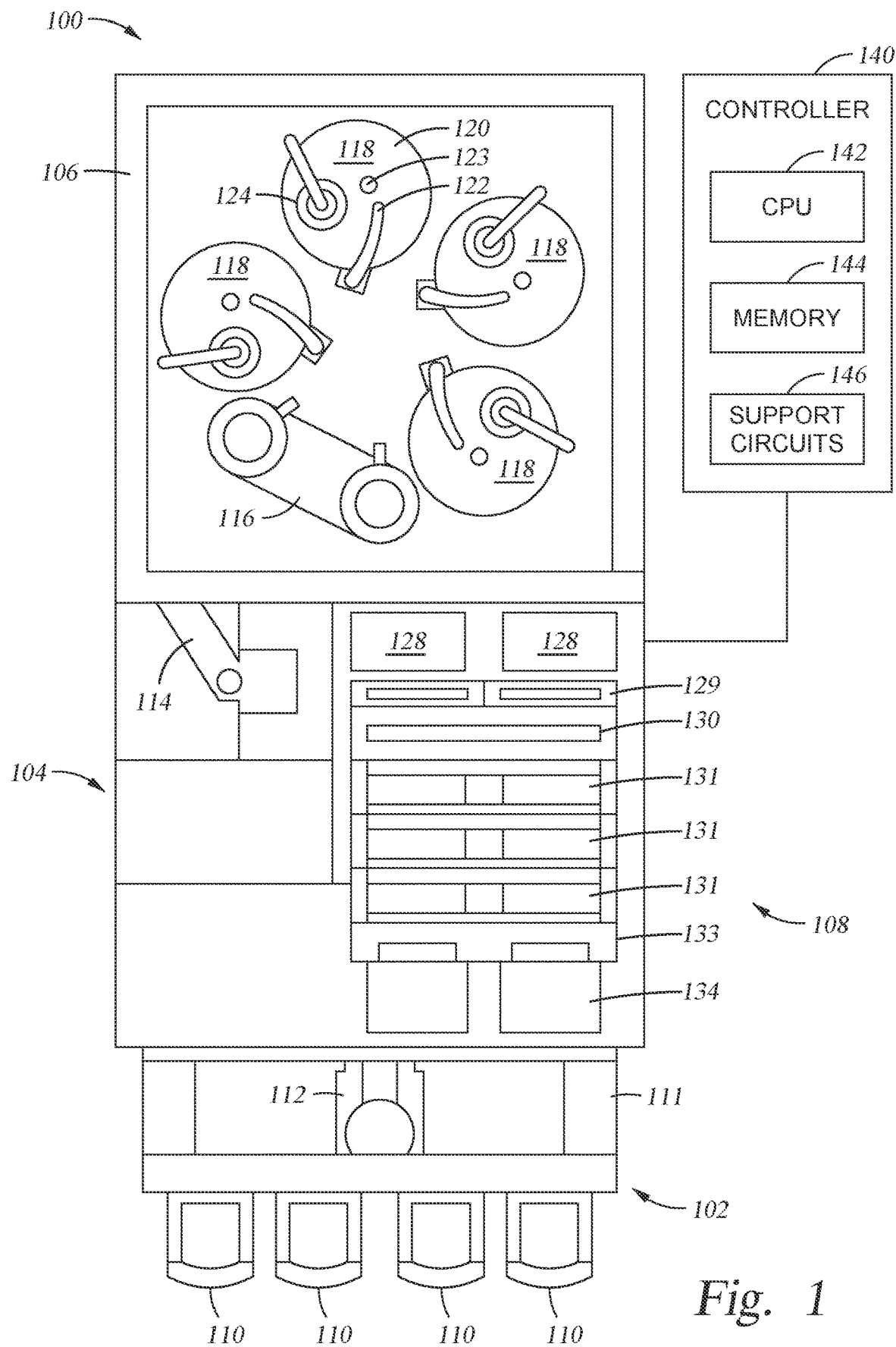
FIG. 1 is a schematic top view of a chemical mechanical polishing (CMP) system according to embodiments discussed herein.

FIG. 1 illustrates a schematic top view of a chemical mechanical polishing (CMP) system 100. The system 100 generally includes a factory interface module 102, input module 104, a polishing module 106, and a cleaning module 108. These four major components are generally disposed within the CMP system 100.

The factory interface 102 includes a support to hold a plurality of substrate cassettes 110, a housing 111 that encloses a chamber, and one or more interface robots 112. The factory interface robot 112 generally provides the range of motion required to transfer substrates between the cassettes 110 and one or more of the other modules of the system 100.

Unprocessed substrates are generally transferred from the cassettes 110 to the input module 104 by the interface robot 112. The input module 104 generally facilitates transfer of the substrate between the interface robot 112 and a transfer robot 114. The transfer robot 114 transfers the substrate between the input module 104 and the polishing module 106.

The polishing module 106 generally comprises a transfer station 116, and one or more polishing stations 118. The transfer station 116 is disposed within the polishing module 106 and is configured to accept the substrate from the transfer robot 114. The transfer station 116 transfers the substrate to a carrier head 124 of a polishing station 118 that retains the substrate during polishing.

The polishing stations 118 each includes a rotatable disk-shaped platen on which a polishing pad 120 is situated. The platen is operable to rotate about an axis. The polishing pad 120 can be a two-layer polishing pad with an outer polishing layer and a softer backing layer. The polishing stations 118 each further includes a dispensing arm 122, to dispense a polishing liquid, e.g., an abrasive slurry, onto the polishing pad 120. In the abrasive slurry, the abrasive particles can be silicon oxide, but some polishing processes use cerium oxide abrasive particles. Each polishing station 118 can also include a conditioner head 123 to maintain the polishing pad 120 at a consistent surface roughness.

The polishing stations 118 each includes at least one carrier head 124. The carrier head 124 is operable to hold a substrate against the polishing pad 120 during polishing operation. Following a polishing operation performed on a substrate, the carrier head 124 transfers the substrate back to the transfer station 116.

The transfer robot 114 then removes the substrate from the polishing module 106 through an opening connecting the polishing module 106 with the remainder of the CMP system 100. The transfer robot 114 removes the substrate in a horizontal orientation from the polishing module 106 and transfers the substrate to the cleaning module 108.

The cleaning module 108 generally includes one or more cleaning devices that can operate independently or in concert. For example, the cleaning module 108 can include, from top to bottom in FIG. 1, one or more pre-clean modules 129, three or more brush cleaners 131, a megasonic cleaner 133, and a drier 134. Other possible cleaning devices include chemical spin cleaners and jet spray cleaners (not shown). A transport system, e.g., an overhead conveyor 130 that supports robot arms, can walk or run the substrates from cleaning device to the cleaning device. Additionally, overhead transfer robots can be used for this same transport of substrates. As will be discussed further below, the three or more brush cleaners 131 are devices in which a substrate can be placed and the surfaces of the substrate are contacted with rotating brushes or spinning buffing pads to remove any remaining particulates. The substrate is then transferred to the megasonic cleaner 133 in which high frequency vibrations produce controlled cavitation in a cleaning liquid to clean the substrate. Alternatively, the megasonic cleaner 133 can be positioned before the brush 131 or pre-clean modules 129. A final rinse can be performed in a rinsing module before being transferred to a drying module 134.

As described above, the CMP system 100 transfers the substrates from the polishing module 106 into the cleaning module 108. Debris from the polishing process, e.g., abrasive particles or organic materials from the polishing pad or slurry, can be stuck to the substrates. Some of these materials, e.g., abrasive particulates, and organic additives from the polishing module 106, are difficult to remove.

A system controller 140, such as a programmable computer, is coupled to the remainder of the system 100, or components thereof. In one or more embodiments, the system controller 140 may control the operation of one or more of the factory interface module 102, the input module 104, the polishing module 106, and the cleaning module 108, including one or more components thereof, including each of the brush cleaners 131. In operation, the system controller 140 enables data acquisition and feedback to coordinate the operation of the factory interface module 102, the input module 104, the polishing module 106, and the cleaning module 108, including one or more components thereof, including each of the brush cleaners 131.

The system controller 140 includes a programmable central processing unit (CPU) 142, which is operable with a memory 144 (e.g., non-volatile memory) and support circuits 146. The support circuits 146 (e.g., cache, clock circuits, input/output subsystems, power supplies, etc., and combinations thereof) are conventionally coupled to the CPU 142 and coupled to the various other components of the system 100.

In some embodiments, the CPU 142 is one of any form of general-purpose computer processor used in an industrial setting, such as a programmable logic controller (PLC), for controlling various monitoring system component and subprocessors. The memory 144, coupled to the CPU 142, is non-transitory and is typically one or more of readily available memory such as random access memory (RAM), read only memory (ROM), floppy disk drive, hard disk, or any other form of digital storage, local or remote.

Herein, the memory 144 is in the form of a computer-readable storage media containing instructions (e.g., non-volatile memory), that when executed by the CPU 142, facilitates the operation of the system 100. The instructions in the memory 144 are in the form of a program product such as a program that implements the methods of the present disclosure (e.g., middleware application, equipment software application, etc.). The program code may conform to any one of a number of different programming languages. In one example, the disclosure may be implemented as a program product stored on computer-readable storage media for use with a computer system. The program(s) of the program product define functions of the embodiments (including the methods described herein).

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Exemplary Scrubbing Device That May Perform Brush Cleaning

Figure 2A:
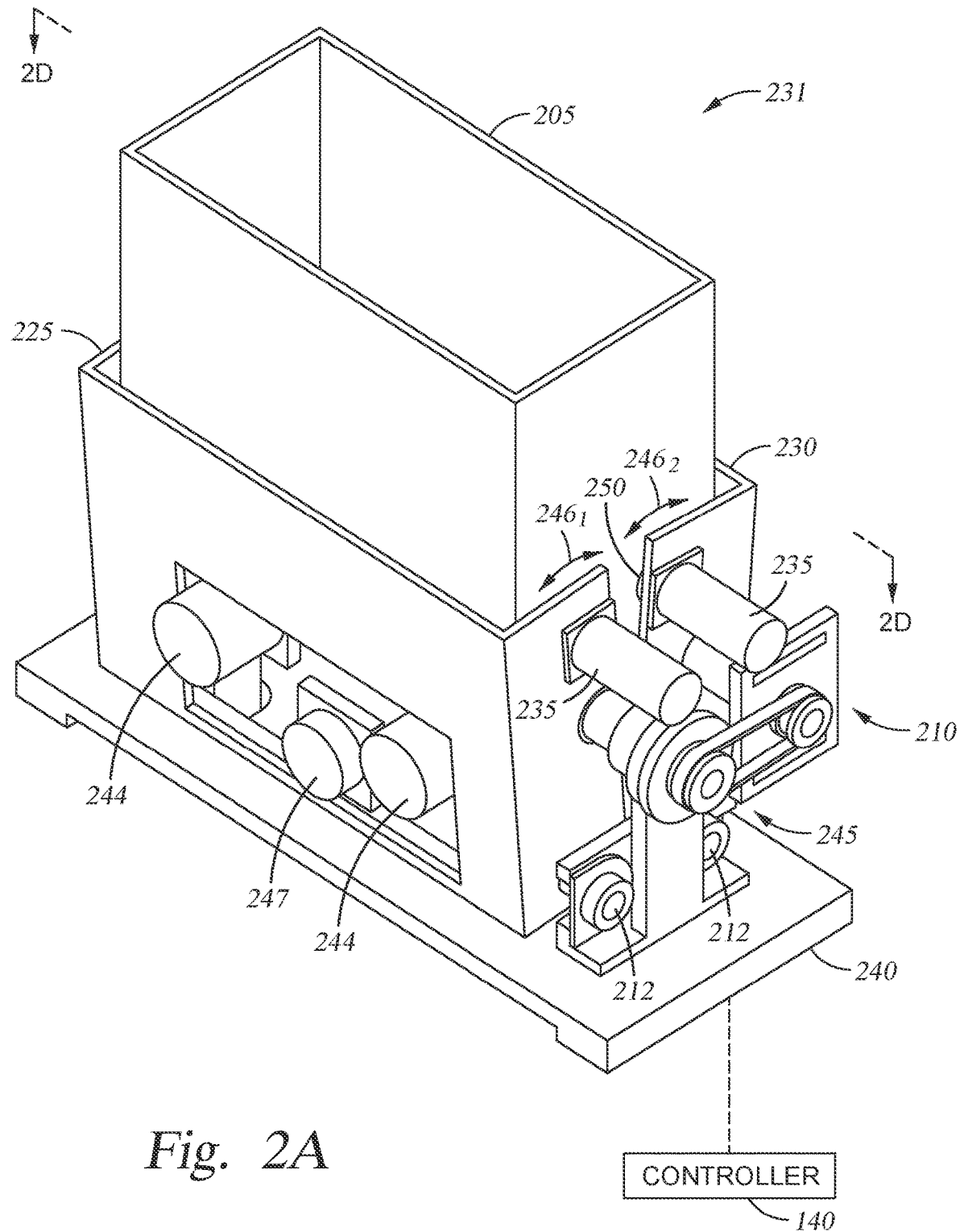
FIG. 2A is a perspective view of an example of a brush cleaner utilized in the CMP processing system of FIG. 1, according to one or more embodiments.

FIG. 2A is an isometric view of a brush cleaner 131 that may be utilized in a cleaning module 108 as described above. The lid portion of the brush cleaner 131, which includes the door, has been removed from FIGS. 2A and 2B for ease of discussion. The brush cleaner 131 shown in FIG. 2A can be a scrubber type brush box-type vertical cleaner. The example brush cleaner 131 includes a tank 205 that is supported by a first support 225 and a second support 230. The brush cleaner 131 includes actuators 235, each actuator 235 coupled to a cylindrical roller 228 located inside the tank 205. The actuators 235 may each include a drive motor, such as direct drive servo motor, that is adapted to rotate the respective cylindrical rollers about axes A' and A". Each of the actuators 235 are coupled to the system controller 140 adapted to control the rotational speed of the cylindrical rollers.

Figure 2B:
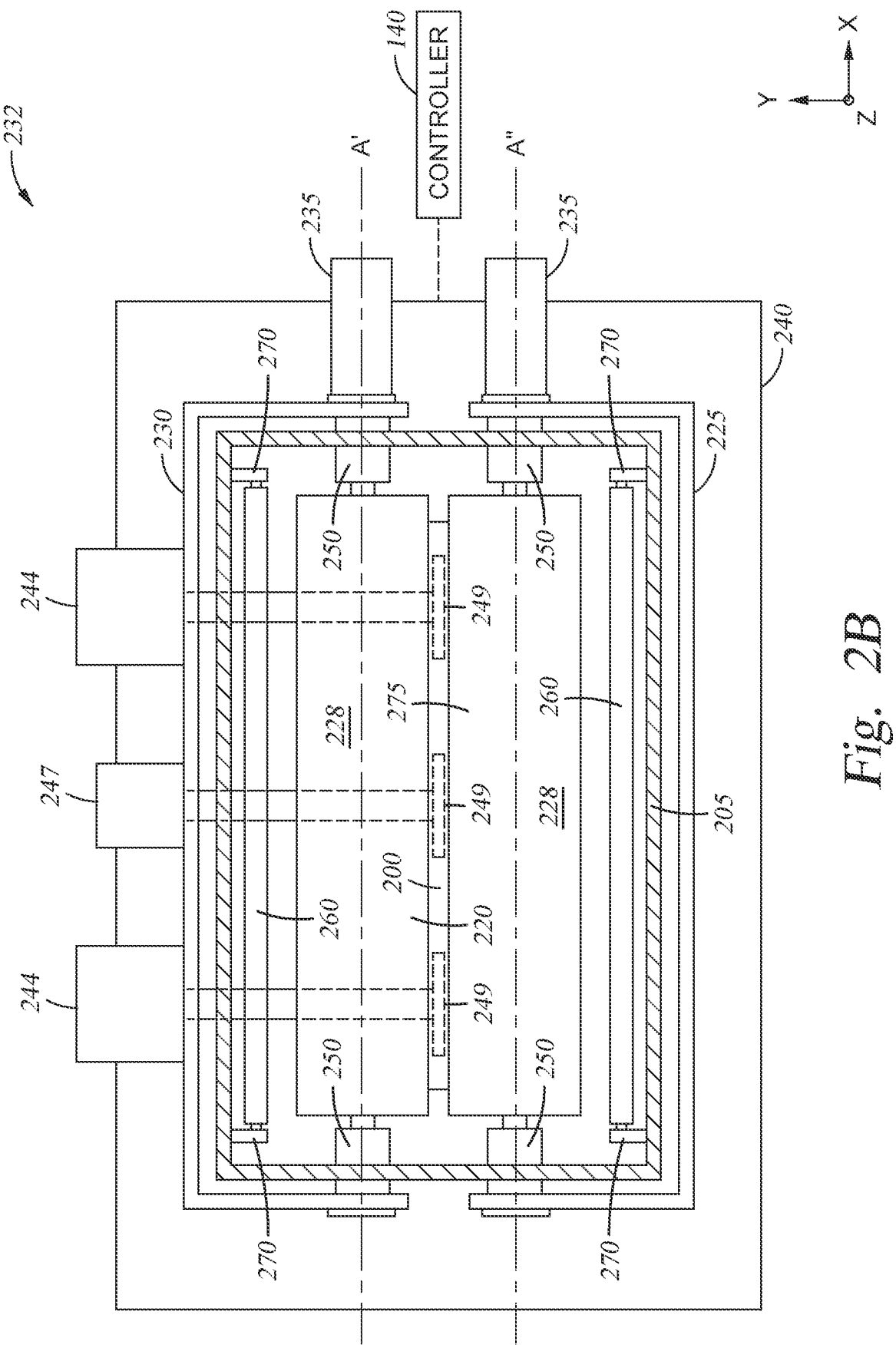
FIG. 2B is a top cross-sectional view of the brush cleaner of FIG. 2A, according to one or more embodiments.
Figure 2C:
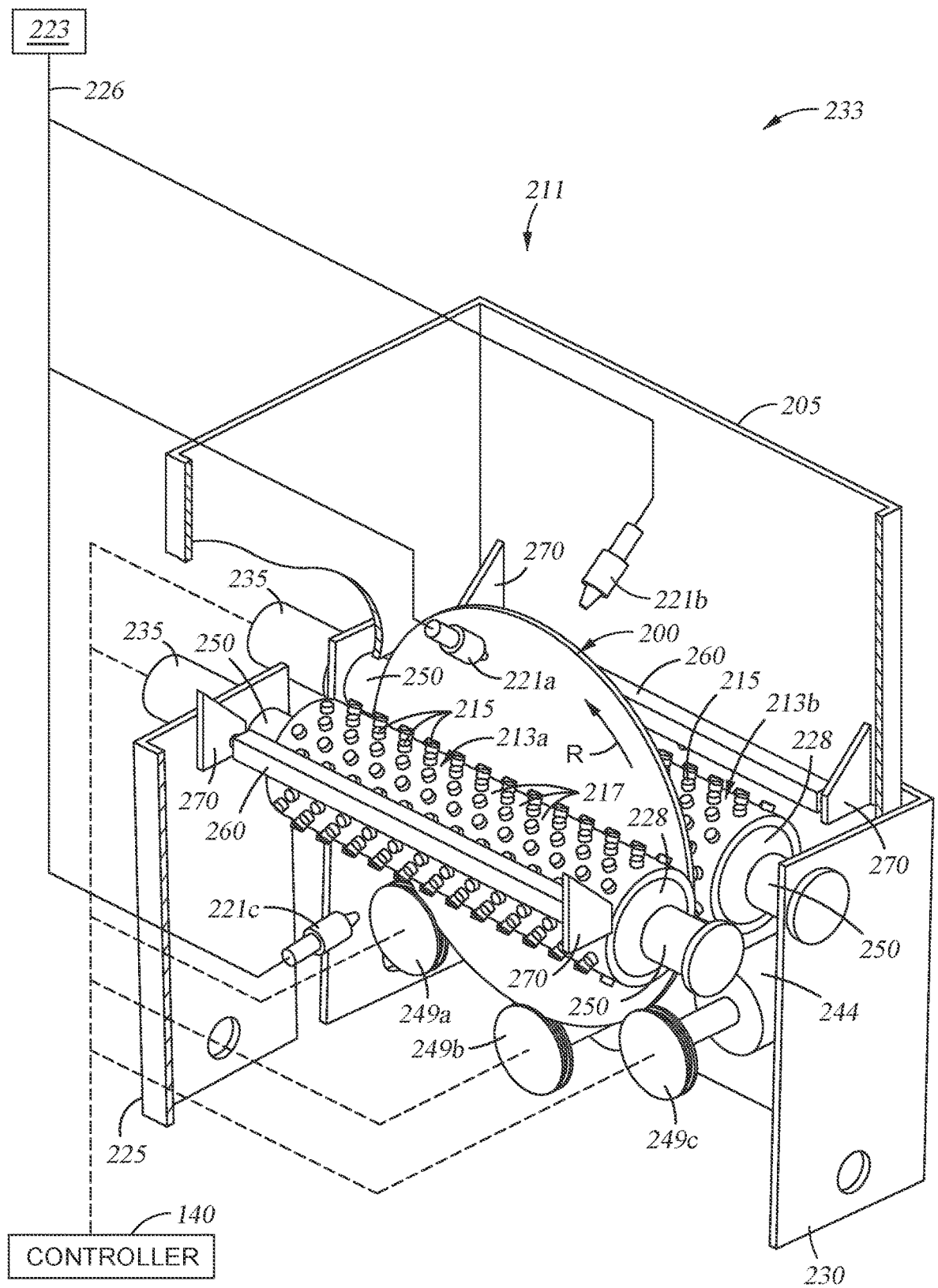
FIGS. 2C-2D depict perspective views of a scrubbing device that performs periodic brush cleaning, according to certain embodiments.
Figure 2D:
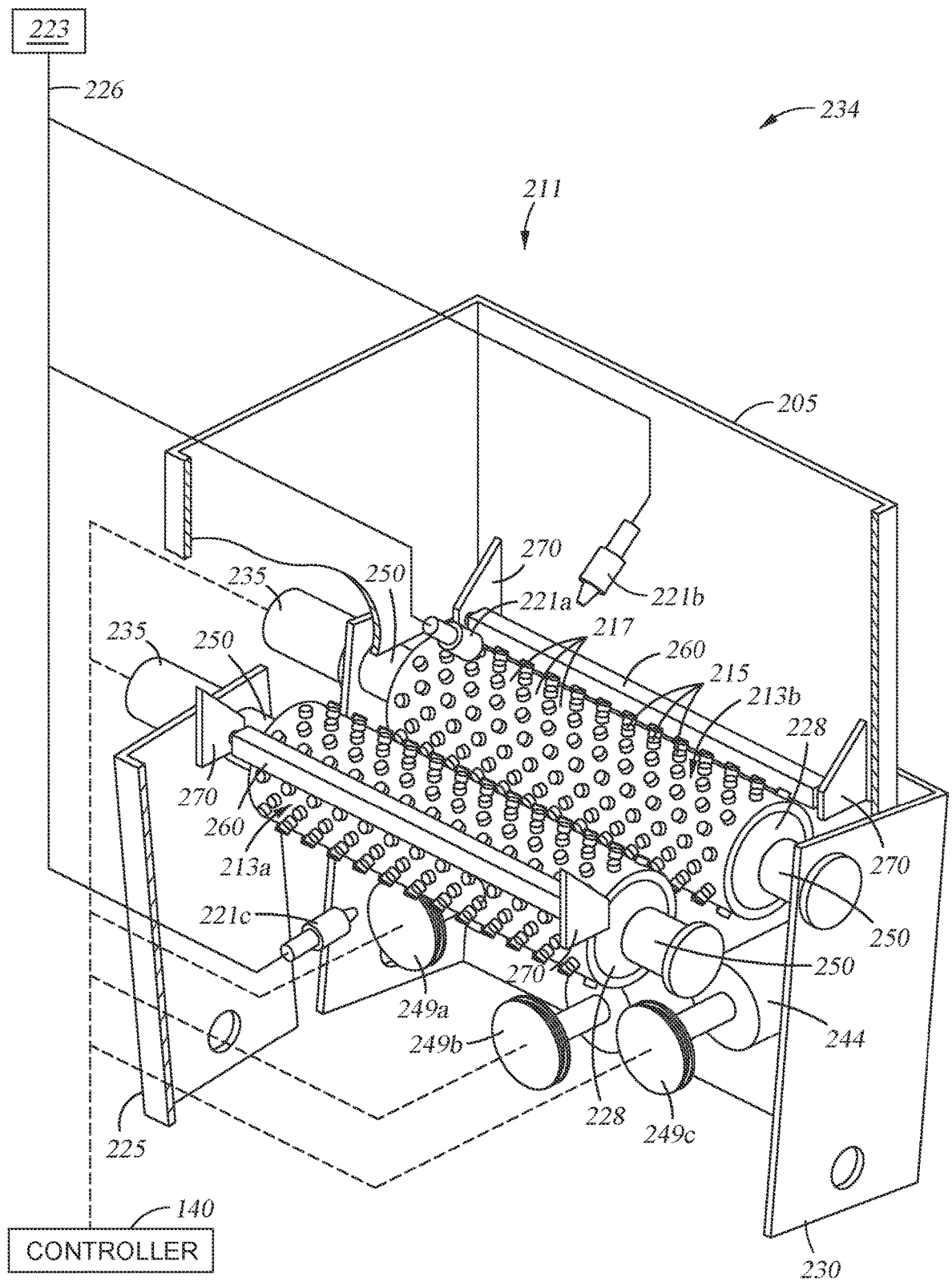

The linkage 210 and actuator 245 are configured to allow movement of the cylindrical rollers 228 located inside the tank 205 relative to the major surfaces of a substrate 200 (shown in FIG. 2B). The actuator 245 is coupled to the controller to control the movement of the linkage 210 relative to a substrate disposed between the cylindrical rollers 228. In operation, the first and second supports 225, 230 may be moved simultaneously relative to the base 240. Such movement may cause the first and second cylindrical rollers 228 to close against the substrate 200 as shown in FIG. 2C, or to cause the first and second cylindrical rollers 228 to be spaced apart as shown in FIG. 2D to allow insertion and/or removal of the substrate 200 from the brush cleaner 131.

FIG. 2B is a top view of the brush cleaner 131 in FIG. 2A showing the cylindrical rollers 228 in a processing position where the cylindrical rollers 228 are closed or pressed against major surfaces of the substrate 200. The brush cleaner 131 also includes one or more drive motors 244 and a rotational device 247. Each of the drive motors 244 and the rotational device 247 include a roller 249, which is disposed at the end of an output shaft of each drive motor 244 and rotational device 247 and are configured to support and/or engage the substrate 200 and facilitate rotation of the substrate 200 about an axis that is parallel to the horizontal plane (i.e., X-Y plane).

Each of the cylindrical rollers 228 include a tubular cover (tubular covers 213a, 213b shown in FIGS. 2C and 2D; not shown in FIG. 2B) disposed thereon. The tubular covers 213a, 213b may be a removable sleeve made of a pad material utilized to polish the substrate 200 or a brush body adapted to clean the substrate 200. Tubular covers 213a, 213b are also referred to as scrubber brushes herein. During processing in the brush cleaner 131 the tubular covers 213a, 213b of the cylindrical rollers 228 are brought into contact with a substrate while they are rotated by the actuators 235, and while the substrate 200 is rotated by use of the supporting rollers 249 that are coupled to the output shafts of the drive motors 244 and rotational device 247. A second processing fluid, such as deionized (DI) water and/or one or more second substrate cleaning fluids (e.g., acid or base containing aqueous solution), is applied to the surface of the substrate 200 from a second fluid source while the substrate 200 and cylindrical rollers 228 are rotated by the various actuators and motors.

According to an embodiment, a dedicated conditioning device 260 may be provided for each of the cylindrical rollers 228. Conditioning device 260 may also be referred to as a "beater bar." The conditioning device 260 is mounted adjacent a sidewall of the tank 205 by one or more support members 270. The conditioning device 260 is positioned away from the center of the tank 205 so as to not interfere with substrate transfer and/or substrate polishing or cleaning processes. However, the conditioning device 260 is positioned to contact each of the cylindrical rollers 228 when the first and second supports 225, 230 are actuated downward and outward away from one another. In one embodiment, the movement of the first and second supports 225, 230 brings the cylindrical rollers 228 into contact with a respective conditioning device 260. In this position, the processing surface of the tubular covers 213a, 213b on each of the cylindrical rollers 228 may be conditioned during relative movement between the cylindrical rollers 228 and the conditioning device 260. In one or more embodiments, the dedicated conditioning device 260 ("beater bar") is used during the brush cleaning operation to enhance the brush cleaning.

FIG. 2C is a perspective view of one or more embodiments of a scrubbing device 211 disposed within the brush cleaner 131. The scrubbing device 211 shown in FIG. 2C is depicted with a substrate 200 loaded therein, such that the scrubbing device 211 is in a loaded state 233. The scrubbing device 211 comprises a pair of cylindrical rollers 228 including a pair of tubular covers 213a, 213b. In one or more embodiments, the pair of tubular covers 213a, 213b are polyvinyl acetate (PVA) brushes. Each brush includes a set of multiple raised nodules 215 across the surface of the brush, and a set of multiple valleys 217 located among the nodules 215. The pair of cylindrical rollers 228 are supported by a pivotal mounting (represented generally by reference number 218) adapted to move the pair of tubular covers 213a, 213b of the cylindrical rollers 228 into and out of contact with the substrate 200 (e.g., a semiconductor wafer) supported by a substrate support (which may also be referred to as a wafer support), thus allowing the cylindrical rollers 228 to move between closed and open positions so as to allow a substrate 200 to be extracted from and inserted therebetween as described below.

The scrubbing device 211 also comprises a substrate support adapted to support and further adapted to rotate a substrate 200. In one aspect, the substrate support may comprise a plurality of rollers 249 a-c (FIGS. 2C-2D) each having a groove adapted to support the substrate 200 vertically. A first motor (or motors) of actuators 235 are coupled to the cylindrical rollers 228 and adapted to rotate the tubular covers 213a, 213b of the cylindrical rollers 228 respectively in rotation directions 203, 204. Second motors 244 are coupled to the rollers 249a and 249c, respectively, and adapted to rotate the rollers 249a and 249c, while a third motor 247 is coupled to rollers 249b and is adapted to rotate the roller 249b.

The scrubbing device 211 may further comprise a plurality of spray nozzles 221 (including at least 221a, 221b, 221c and 221d) coupled to a source 223 of substrate cleaning fluid via a supply pipe 226. The spray nozzles 221 may be positioned to spray a substrate cleaning fluid (e.g., deionized (DI) water, dilute ammonium hydroxide ($NH_4OH$), dilute hydrogen peroxide ($H_2O_2$), $NH_4OH$ and $H_2O_2$ mixture (SC1), dilute hydrofluoric acid, sulfuric acid ($H_2SO_4$) and hydrogen peroxide ($H_2O_2$) mixture (SPM), Electra clean, or any other liquid solution used for substrate cleaning) at the surfaces of the substrate 200 or at the one or more scrubber brushes (e.g., including tubular covers 213a, 213b) during a scrubbing process. In one or more embodiments, substrate cleaning fluid and/or brush cleaning fluid, discussed below, may be supplied from an internal region of the scrubber brushes (e.g., cylindrical rollers 228 and tubular covers 213a, 213b) themselves. Fluids provided to the interior of the scrubber brushes will pass through pores in the tubular covers 213 to clean the surface of the substrate or remove debris found on the surface of the scrubber brushes.

FIG. 2B is a perspective view of the one or more embodiments of the scrubbing device 211 of the brush cleaner 131, depicted when a substrate is not loaded, such that the scrubbing device 211 is in an idle state 234. In the idle state 234, the scrubbing device 211 may perform a brush cleaning operation. In one or more embodiments, when performing a brush cleaning operation, the scrubbing device 211 is not available to perform a substrate cleaning operation. The plurality of spray nozzles 221 is coupled to a source 223 of brush cleaning fluid via the supply pipe 226. The spray nozzles 221 may be positioned to spray the brush cleaning fluid at the one or more scrubber brushes (e.g., including tubular covers 213a, 213b). In one or more embodiments, brush cleaning fluid may be supplied through the scrubber brushes themselves. In one or more embodiments, the brush cleaning fluid is the same as the substrate cleaning fluid (e.g., deionized (DI) water, dilute ammonium hydroxide ($NH_4OH$), dilute hydrogen peroxide ($H_2O_2$), $NH_4OH$ and $H_2O_2$ mixture (SC1), dilute hydrofluoric acid, sulfuric acid ($H_2SO_4$) and hydrogen peroxide ($H_2O_2$) mixture (SPM), Electra clean).

In one or more embodiments, the brush cleaning fluid is different from the substrate cleaning fluid. For example, the brush cleaning fluid is hydrofluoric acid (e.g., dilute hydrofluoric acid), SPM, or SC1 (e.g., hydrogen peroxide) and the substrate cleaning fluid is a different solution from hydrofluoric acid, SPM or SC1. In this case, it is desirable to use a brush cleaning fluid that is configured to efficiently clean and remove debris from the surfaces of the scrubber brushes to improve subsequent substrate cleaning steps. However, these brush cleaning chemistries may attack and damage one or more materials disposed on a surface of a substrate that is to be cleaned in the brush cleaner 131. Therefore, the brush cleaning processes need to be performed separately of the substrate cleaning processes.

In one or more embodiments, the spray nozzles 221 include a first set of spray nozzles 221a for the substrate cleaning fluid, and a second set of spray nozzles 221b, 221c for the brush cleaning fluid. In these embodiments, the supply pipe 226 is separated into separate supplies (not shown) for the source 223 of the substrate cleaning fluid and the brush cleaning fluid.

According to an embodiment of the disclosure herein, the cleaning module 108 may be configured to sequentially process each substrate 200 through two brush cleaners 131 of the three or more brush cleaners 131 within the cleaning module 108 to perform a two-step cleaning process, as is discussed further below. That is, after the substrate 200 undergoes cleaning processing in a first brush cleaner 131, the overhead conveyor 130 then transfers the substrate 200 to a second brush cleaner 131 for further cleaning processing. During a cleaning process sequence, after processing for a first period time in the first brush cleaner 131 the substrate is then transferred to the second brush cleaner 131 and then processed for a second period of time. In one or more embodiments, the first period of time is substantially similar to the first period of time. The processes performed in the first brush cleaner 131 and second brush cleaner 131 can include using similar fluid chemistries and mechanical processing parameters (e.g., cylindrical roller rotation speeds and application forces). In some embodiments, the first brush cleaner 131 is adapted to perform a rough cleaning step to remove the bulk of the remaining contaminants (e.g., particles, abrasive particles, chemical residue, etc.) remaining on the surface of the substrate after performing the first cleaning process in the first cleaning module, and the second brush cleaner 131 is configured to perform a cleaning process that is adapted to remove any remaining contaminants leftover from the process performed in the first brush cleaner 131.

FIGS. 3-6 depict cleaning sequence patterns 300, 400, 500, 600 for periodic brush cleaning in a CMP system according to certain embodiments. Brush cleaners 131a, 131b, 131c may be examples of brush cleaners 131 described with reference to FIGS. 1-2D. In one or more embodiments, the CMP system is as described with reference to FIG. 1. In one or more embodiments, the patterns 300, 400, 500, 600 for periodic brush cleaning are employed in other systems where a substrate may be cleaned using a set of brush cleaners, and brush cleaning is used or desirable.

Figure 3:
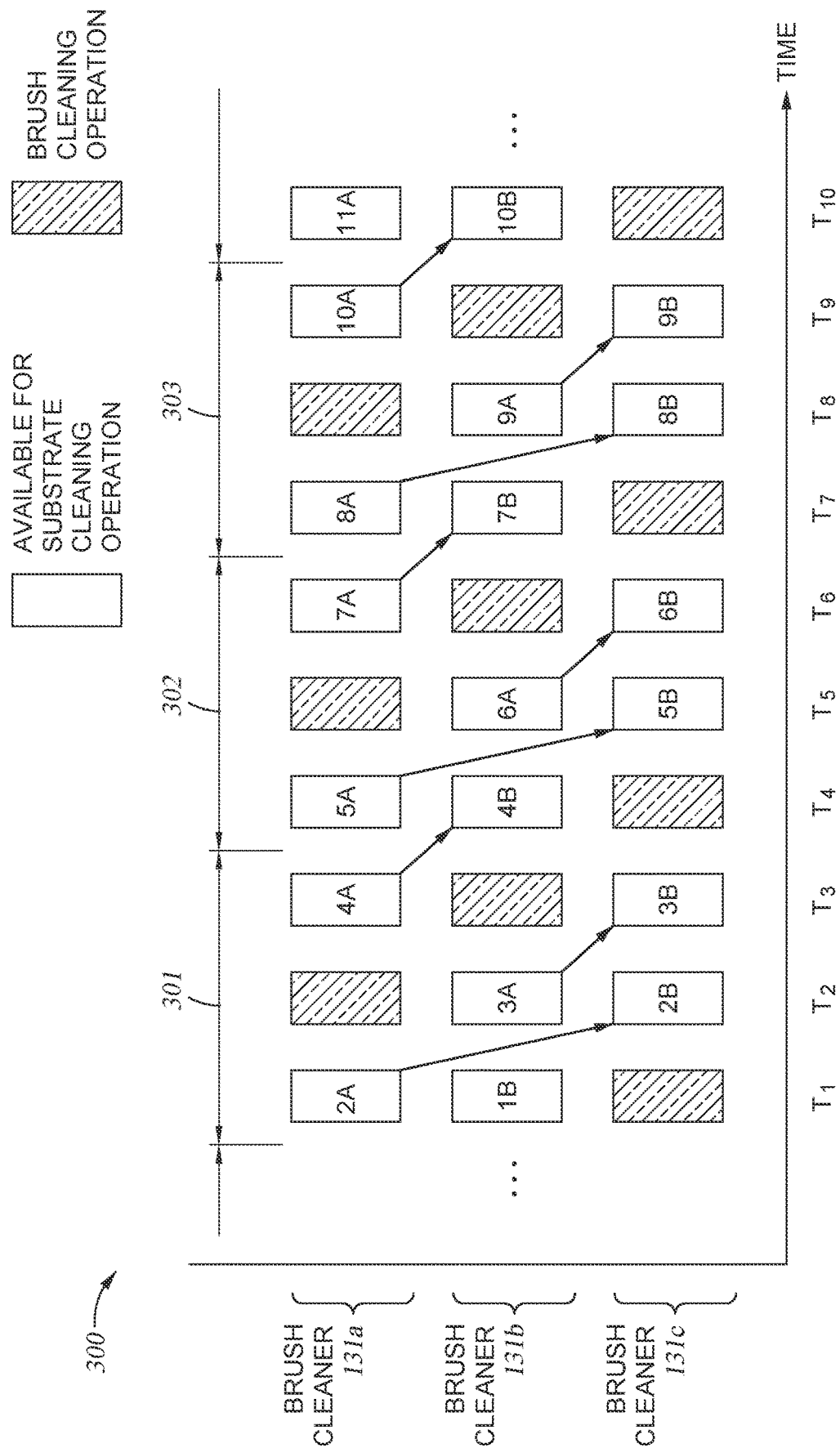
FIGS. 3-6 depict cleaning sequence patterns for periodic brush cleaning in a CMP system according to certain embodiments.

FIG. 3 depicts a cleaning sequence pattern 300 for periodic brush cleaning employing a regular rotation of brush cleaning of a series of substrates among the brush cleaners 131. A time period (which may also be equivalently referred to herein as a cleaning cycle) includes a set number of time durations. According to pattern 300, the one or more scrubber brushes (e.g., including tubular covers 213a, 213b) of each brush cleaner 131 is cleaned during each time duration of a time period. Each brush cleaner 131 is sequentially (regularly, periodically) unavailable for a substrate cleaning operation while the one or more scrubber brushes are cleaned in the brush cleaner, for example according to a regular brush cleaning process rotation. The one or more brush cleaners 131 that are not performing the brush cleaning operation are available for a substrate (e.g., wafer) cleaning operation. One advantage of pattern 300 is that one brush cleaner 131 is cleaned in parallel with the two other brush cleaners 131 performing one step of the two-step cleaning process, such that the one or more scrubber brushes are consistently cleaned while at least two brush cleaners 131 remain available for substrate cleaning operations, such that the flow of substrates that are cleaned remains constant, without an interruption to the substrate processing sequence performed in the cleaning module 108 to clean the scrubber brushes.

In FIGS. 3-6, a substrate in a loaded brush cleaner 131 is indicated by number for the substrate, followed by whether the brush cleaner is in a first step (A) of a two-step cleaning operation, or in a second step (B) of the two-step cleaning operation.

According to the cleaning sequence pattern 300, during a first time duration $t_1$ of time period 301, brush cleaner 131a is in a loaded state (e.g., loaded state 233) performing a substrate cleaning operation for a first substrate and brush cleaner 131b is in a loaded state (e.g., loaded state 233) performing a substrate cleaning operation for a second substrate. Also during the first time duration $t_1$ of time period 301, brush cleaner 131c is in an idle state (e.g., idle state 234) performing a brush cleaning operation to clean the scrubber brushes (e.g., tubular covers 213a, 213b). In one or more embodiments, the brush cleaning operation may use a different cleaning solution than the cleaning solution used for the substrate cleaning operation. As noted above, the brush cleaning process may entail provide a brush cleaning fluid to an exterior surface of the scrubber brushes by the nozzles (e.g., spray nozzles 221b, 221c) and/or deliver the brush cleaning fluid to the interior of the scrubber brushes so that the internally delivered brush cleaning fluid can pass through pores in the tubular covers 213 to remove debris found on the surface of the scrubber brushes.

During a second time duration $t_2$ of time period 301, a different brush cleaner 131 may perform the cleaning operation than during the first time duration $t_1$ according to the cleaning sequence pattern 300. In one or more embodiments, brush cleaners 131b, 131c are in the loaded state (e.g., loaded state 233) performing the substrate cleaning operation, and brush cleaner 131a is in the idle state performing the brush cleaning operation.

In one or more embodiments, the substrate is cleaned in a brush cleaner 131 during a first time duration (e.g., $t_1$) may be passed to a different brush cleaner 131 during the next time duration (e.g., $t_2$) as part of a two-step cleaning process. A first substrate (1B) is cleaned in brush cleaner 131b during time duration $t_1$ is on the second step of the two-step cleaning operation (the first step of the two-step cleaning operation having been performed during a time duration prior to the first time duration $t_1$ of the first time period 301). A second substrate (2A) cleaned in brush cleaner 131a during time duration $t_1$ is passed to brush cleaner 131c during the second time duration $t_2$ (now 2B).

During a third time duration $t_3$ of time period 301, a yet different brush cleaner 131a may perform the brush cleaning operation than during the first time duration $t_1$ and the second time duration $t_2$ according to the pattern 300. In one or more embodiments, brush cleaners 131b, 131c are in the loaded state (e.g., loaded state 233) performing the substrate cleaning operation, and brush cleaner 131a is in the idle state performing the brush cleaning operation.

In one or more embodiments, the third substrate (3A) that is cleaned in a brush cleaner 131b during the second time duration $t_2$ may be passed to a different brush cleaner 131c during the third time duration $t_3$ (now 3B) as part of the two-step cleaning process. The first substrate cleaned in brush cleaner 131c during time duration $t_2$ (2B) is on the second step of the two-step cleaning operation (the first step of the two-step cleaning operation having been performed during the time duration $t_1$ (2A) in brush cleaner 131a), and the first substrate may be passed on to the next cleaning module (e.g., megasonic cleaner 133 or drier 134) within the cleaning module 108 or passed out of the cleaning module 108 at the end of time duration $t_2$ (2B), and a fourth substrate (4A) introduced to the cleaning module 108 and cleaned in brush cleaner 131a during time duration $t_3$.

According to the pattern 300, time period 302 may repeat the pattern of loaded and idle states for the brush cleaners 131 during time durations $t_4$, $t_5$, and $t_6$, and time period 303 may repeat the pattern of loaded and idle states for the brush cleaners 131 during time durations $t_7$, $t_8$, and $t_9$, and so on.

Pattern 300 may provide for improved brush cleanliness and cleaning consistency, while allowing for increased substrate cleaning throughput, for example because at least two brush cleaners 131 are always available for substrate cleaning operations.

Figure 4:
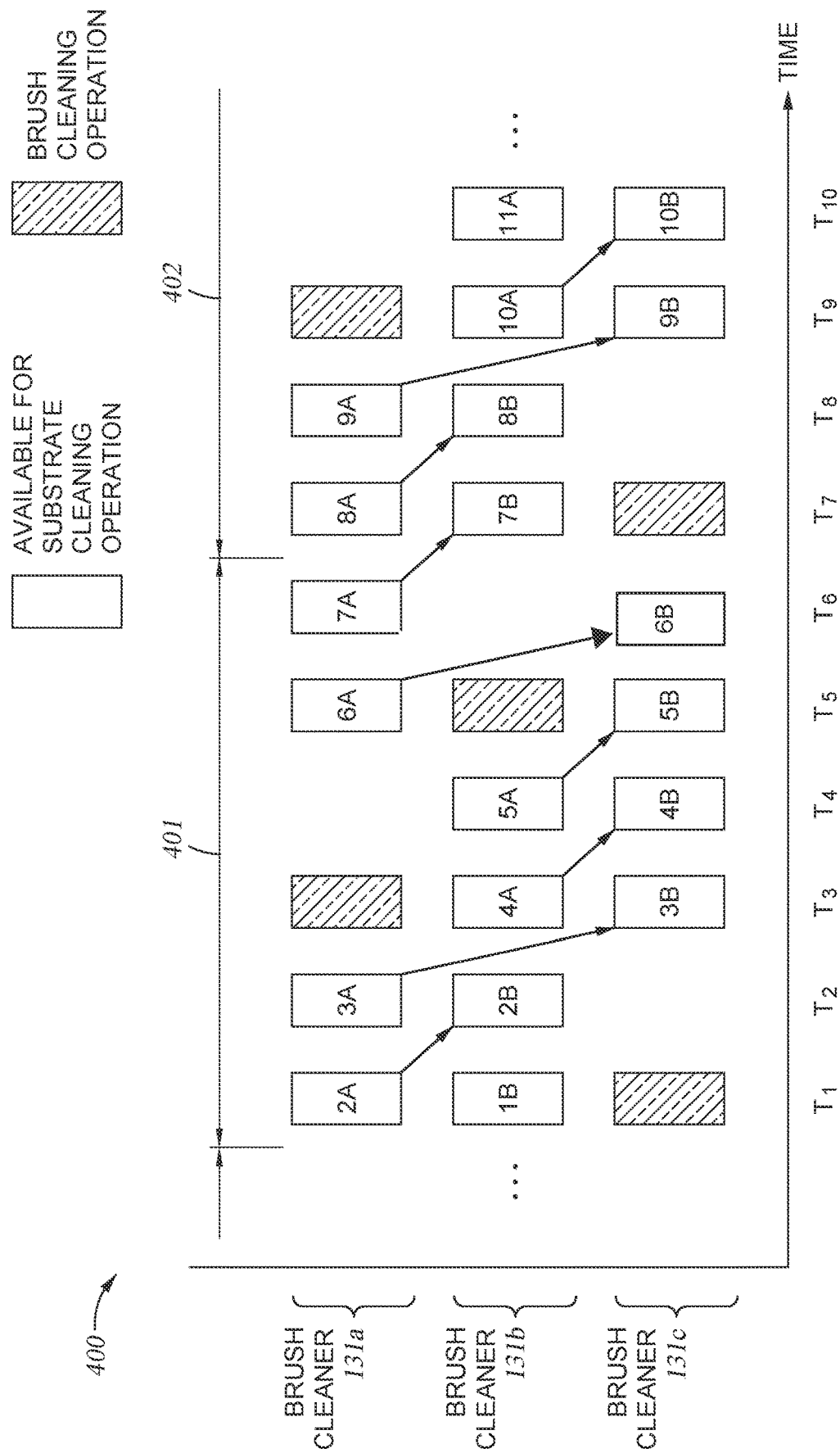

FIG. 4 depicts a cleaning sequence pattern 400 for periodic brush cleaning employing a regular rotation of brush cleaning among the brush cleaners 131, where the brush cleaning operation is not switched between brush cleaners 131 for each subsequent time duration. In one or more embodiments, the brush cleaning operation may be performed at least during one time duration (e.g., brush cleaner 131c performs the brush cleaning operation during $t_1$). As illustrated in FIG. 4, in a subsequent time duration (e.g., $t_2$), the brush cleaner 131c is now clean, but sits idle, awaiting loading by a substrate in a subsequent time duration (e.g., the third substrate (3B) is loaded into and cleaned in brush cleaner 131c during time duration $t_3$). In other embodiments, the brush cleaner 131c may continue a cleaning operation for a time duration longer than time duration $t_1$, for example continuing over all or part of time duration $t_2$. In one or more embodiments, the cleaning duration may be a shorter duration than time duration $t_1$, for example a portion of time duration $t_1$.

A time period includes a set number of time durations including a certain number of time durations. According to cleaning sequence pattern 400, the one or more scrubber brushes (e.g., cylindrical rollers 228 and tubular covers 213a, 213b) of each brush cleaner 131 is cleaned during at least one time duration of a time period for the substrate cleaning operation (e.g., the time duration for one brush cleaning operation may be less than one time duration, one time duration, more than one time duration but less than two time durations, or span two time durations for substrate cleaning operations). Each brush cleaner 131 is sequentially (regularly, periodically) unavailable for a substrate cleaning operation while the one or more scrubber brushes are cleaned in the brush cleaner. The one or more brush cleaners 131 that are not performing the brush cleaning operation are available for a substrate (e.g., wafer) cleaning operation.

As such, according to the cleaning sequence pattern 400, during a first time duration $t_1$ of time period 401, brush cleaners 131a, 131b are in a loaded state (e.g., loaded state 233) performing a substrate cleaning operation for a second substrate (2A) and first substrate (1B), respectively. Also during the first time duration $t_1$ of time period 401, brush cleaner 131c is in an idle state (e.g., idle state 234) performing a brush cleaning operation. In one or more embodiments, the brush cleaning operation occurs during time duration $t_1$ of time period 401. In other embodiments, the brush cleaning operation spans multiple time durations, including at least time duration $t_1$ and $t_2$ of time period 401. During time duration $t_2$, brush cleaners 131a, 131b are again in a loaded state, but the substrates (2B and 3A) that are being cleaned are different or switched to a different brush cleaner 131 than during time duration $t_1$.

The brush cleaning operation may conclude for brush cleaner 131c, such that substrates may be loaded into brush cleaner 131c for time durations $t_3$ (3B), and $t_4$ (4B) of time period 401, and brush cleaners 131b, 131c are available for substrate cleaning operations for time durations $t_3$, $t_4$. The brush cleaning operation for brush cleaner 131a is performed for time durations $t_3$, $t_4$. In one or more embodiment, the brush cleaning operation occurs during time duration $t_3$, and brush cleaning 131a is idle during time durations $t_4$. In one or more other embodiments, the brush cleaning operation occurs in at least a portion of or spans time durations $t_3$, $t_4$. The brush cleaning operation may conclude for brush cleaner 131a, such that substrates 6A and 7A are loaded into brush cleaner 131a for time durations $t_5$, $t_6$ of time period 401, and brush cleaners 131a, 131c are available for substrate cleaning operations for time durations $t_5$, $t_6$. The brush cleaning operation for brush cleaner 131b may be performed for time durations $t_5$, $t_6$. (e.g., at least a portion of time duration $t_5$ or spanning $t_5$, $t_6$)

According to the cleaning sequence pattern 400, time period 401 may repeat the pattern of loaded and idle states for the brush cleaners 131 during subsequent time periods, including time period 402 that includes time durations $t_7$, $t_8$, $t_9$, $t_{10}$, and so on.

Cleaning sequence pattern 400 may provide for increased time for a brush cleaning operation, lower frequency of brush cleaning, and improved brush cleaning efficacy, for example where an increased time between brush cleaning operations is desirable and a longer time for the brush cleaning operation may be used.

Figure 5:
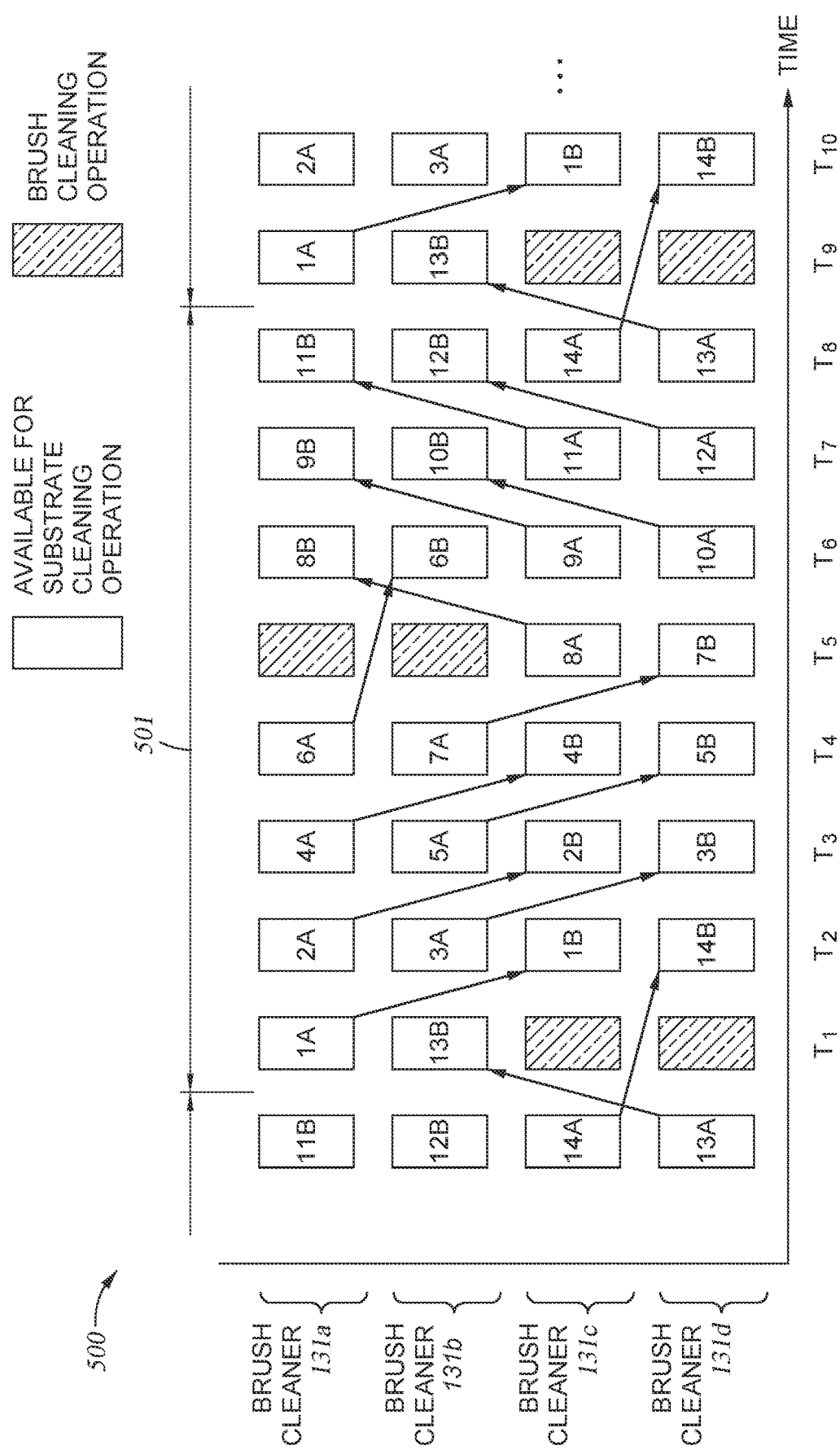

FIG. 5 depicts a cleaning sequence pattern 500 for periodic brush cleaning employing a regular rotation of brush cleaning among the brush cleaners 131, where a brush cleaning process does not occur during each time duration. A time period includes a set number of time durations including a certain number of time durations. According to cleaning sequence pattern 500, the one or more scrubber brushes (e.g., cylindrical rollers 228 and tubular covers 213a, 213b) of each brush cleaner 131 is cleaned for a time duration, and no brush cleaner 131 is cleaned during other time durations. Each brush cleaner 131 is sequentially (regularly, periodically) unavailable for a substrate cleaning operation while the one or more scrubber brushes are cleaned in the brush cleaner 131. The one or more brush cleaners 131 that are not performing the brush cleaning operation are available for a substrate (e.g., wafer) cleaning operation.

In one or more embodiments, the time durations during which the scrubber brushes are cleaned in a time period may be separated by one or more time durations, such that during one or more time durations of the time period all brush cleaners are available to operate to clean substrates therein. The time durations during which one of the scrubber brushes are cleaned for a brush cleaner 131 may be spaced apart, or two or more brush cleaners may perform a substrate cleaning operation during a single time duration of the time period.

According to the cleaning sequence pattern 500, the CMP system 100 each brush cleaner 131 performs a substrate cleaning operation once during time period 501, which includes eight time duration. Brush cleaners 131a and 131b perform the brush cleaning operation during a same time duration, and brush cleaners 131c and 131d perform the brush cleaning operation during a same time duration that is different than the time duration for brush cleaners 131a and 131b.

Although pattern 500 illustrates a time period that includes eight time durations, with two sets of three time durations of no brush cleaning operations (e.g., $t_2$, $t_3$, $t_4$, $t_6$, $t_7$, $t_8$) between brush cleaning operations (e.g., $t_1$, $t_5$), different numbers and numbers and arrangements of brush cleaning operations can also be used, consistent with the disclosure herein. For example, in one or more embodiments, time period 501 has three time durations, where one of the time durations has no brush cleaning operation performed. In other embodiments, the time period 501 has four time durations in total (e.g., $t_1$, $t_2$, $t_3$, $t_4$), where one time duration during which no brush cleaning operation occurs (e.g., $t_2$, $t_4$) is between each brush cleaning operation (e.g., $t_1$, $t_3$).

Cleaning sequence pattern 500 illustrates that, during a first time duration $t_1$ of time period 501, brush cleaners 131a, 131b are in a loaded state (e.g., loaded state 233) performing a substrate cleaning operation for a first substrate (1A) and substrate (13B) that started its two-stage cleaning operation during a prior time period, respectively. Also during the first time duration $t_1$ of time period 501, brush cleaners 131c, 131d are in an idle state (e.g., idle state 234) performing a brush cleaning operation. During time duration $t_2$, all of brush cleaners 131a, 131b, 131c, 131d are again in a loaded state, but the substrates that are being cleaned are different or switched to a different brush cleaner 131 (substrates 1B and 14B, which is from the prior time period) than during time duration $t_1$, and a third and fourth substrate (2A and 3A) are loaded in brush cleaners 131A, 131B, respectively for a substrate cleaning operation. During time duration $t_2$, no brush cleaning operation is being performed for brush cleaners 131a, 131b, 131c, 131d.

During a third time duration $t_3$ and a fourth time duration $t_4$ of time period 501, the brush cleaners 131a, 131b, 131c, 131d are in the loaded state (e.g., loaded state 233) performing a substrate cleaning operation. During a fifth time duration $t_5$ of time period 501, the brush cleaners 131c, 131d are in the loaded state (e.g., loaded state 233) performing a substrate cleaning operation for a seventh substrate (7B) and eighth substrate (8A), and brush cleaners 131a, 131b are in the idle state (e.g., idle state 234) performing a brush cleaning operation. During a sixth, seventh, and eighth time durations $t_6$, $t_7$, to, of time period 501, brush cleaners 131a, 131b, 131c, 131d are all in the loaded state (e.g., loaded state 233) performing a substrate cleaning operation, and no brush cleaning operation is being performed for brush cleaners 131a, 131b, 131c, 131d.

Cleaning sequence pattern 500 may provide for increased substrate cleaning throughput, for example where a decreased frequency of brush cleaning is desirable and within tolerances.

Figure 6:
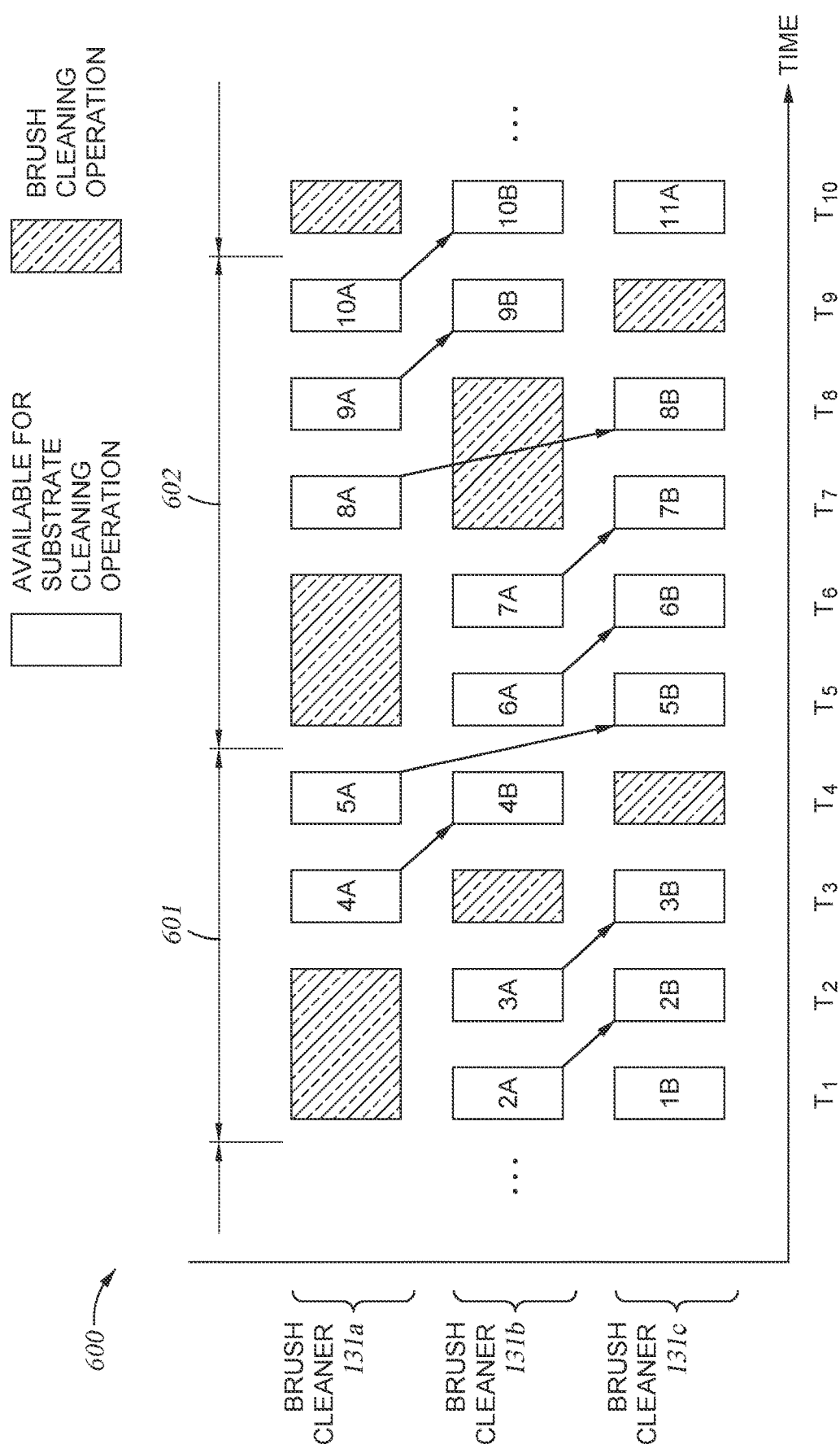

FIG. 6 depicts a cleaning sequence pattern 600 for periodic brush cleaning employing a rotation of brush cleaning among the brush cleaners 131 where different ones of brush cleaner 131 use different time durations for brush cleaning. In one or more embodiments, different time periods include a different number of time durations. According to pattern 600, time period 601 includes four time durations, and time period 602 includes five time durations.

During time period 601, brush cleaner 131a performs a brush cleaning operation spanning two time durations, including for a first substrate (1B) cleaned in a first step of a two-step cleaning procedure in a prior time period and a second substrate (2A) loaded and cleaned in a first time duration $t_1$, and a second time duration $t_2$ that includes the second substrate (2B) cleaned in a second step of the two-step cleaning procedure and a third substrate (3A) loaded and cleaned in a first step of the two-step cleaning procedure.

In the remaining time durations of time period 601, brush cleaner 131b performs a brush cleaning operation spanning one time duration $t_3$, and substrates 4A and 3B are cleaned in brush cleaners 131a and 131c, respectively, in time duration $t_3$. Brush cleaner 131c performs a brush cleaning operation spanning one time duration $t_4$, and substrates 4B and 5A are cleaned in brush cleaners 131b and 131a, respectively in time duration $t_4$.

During time period 602, brush cleaner 131a performs a brush cleaning operation spanning two time durations $t_5$, $t_6$. Brush cleaner 131b performs a brush cleaning operation spanning two time duration $t_7$, $t_8$. Brush cleaner 131c performs a brush cleaning operation spanning one time duration $t_9$.

In one or more embodiments, in a time period subsequent to time period 601, the first time period has four time durations (e.g., 601) and alternates with a second time period that has five time durations (e.g., 602). As such, brush cleaner 131a is cleaned for two time durations each time period, brush cleaner 131c is cleaned for one time duration each time period, and brush cleaner 131b is cleaned for a time duration that alternates between one time duration and two time durations.

Cleaning sequence pattern 600 may provide for increased configurability and flexibility in the system, for example where different numbers of cleaning steps, cleaning chemistries, or brush configurations are used.

In one or more embodiments, one or more of patterns 300, 400, 500, 600 may use "dummy wafers" (which may also be referred to as a "dummy substrate") when performing a brush cleaning operation to clean the scrubber brushes. The "dummy wafers" may be cycled through the brush cleaners 131 separately or in parallel with "product wafers" that are being cleaned in other of the brush cleaners 131. The "dummy wafers" are stored in a queue in the CMP system 100. In one or more embodiments, the "dummy wafers" are of substantially the same size and shape as the "product wafers" and compatible with the brush cleaning fluid. In one or more embodiments, the used, old "dummy wafers" are periodically (e.g., after a quantity of cleaning cycles, manually or automatically) removed and replaced with a new "dummy wafer" in the CMP system 100.

In one or more embodiments, "dummy wafers" are used and replace (substitute for the functionality of) conditioning device 260. In other embodiments, "dummy wafers" are used in addition to use of conditioning device 260. In some embodiments, use of "dummy wafers" may simplify maintenance and operation of CMP system 100 because the "dummy wafers" are easier to replace than conditioning device 260.

Although patterns 300, 400, 500, 600 depict the use of three or four brush cleaners 131, a greater or fewer number of brush cleaners 131 can be used consistent with the disclosure herein.

In one or more embodiments, two brush cleaners 131a, 131b are used, where each brush cleaner alternates between being available for a substrate cleaning operation in a first time duration and performing a brush cleaning operation in a second time duration, such that on brush cleaning 131 is available at a given time duration for substrate cleaning operations. In one or more other embodiments, the brush cleaner 131a performs brush cleaning operations during a set of time durations that include every fourth time duration, while the brush cleaner 131b performs brush cleaning operations during a set different of time durations that include every fourth time duration.

In one or more embodiments, four or more brush cleaners 131 are used, where different brush cleaners perform the brush cleaning operation during different time durations. In one embodiment, a three-step cleaning process is used with four brush cleaners 131, such that each brush cleaner performs the brush cleaning operation every fourth time duration and three brush cleaners are available during a given time duration.

Figure 7:
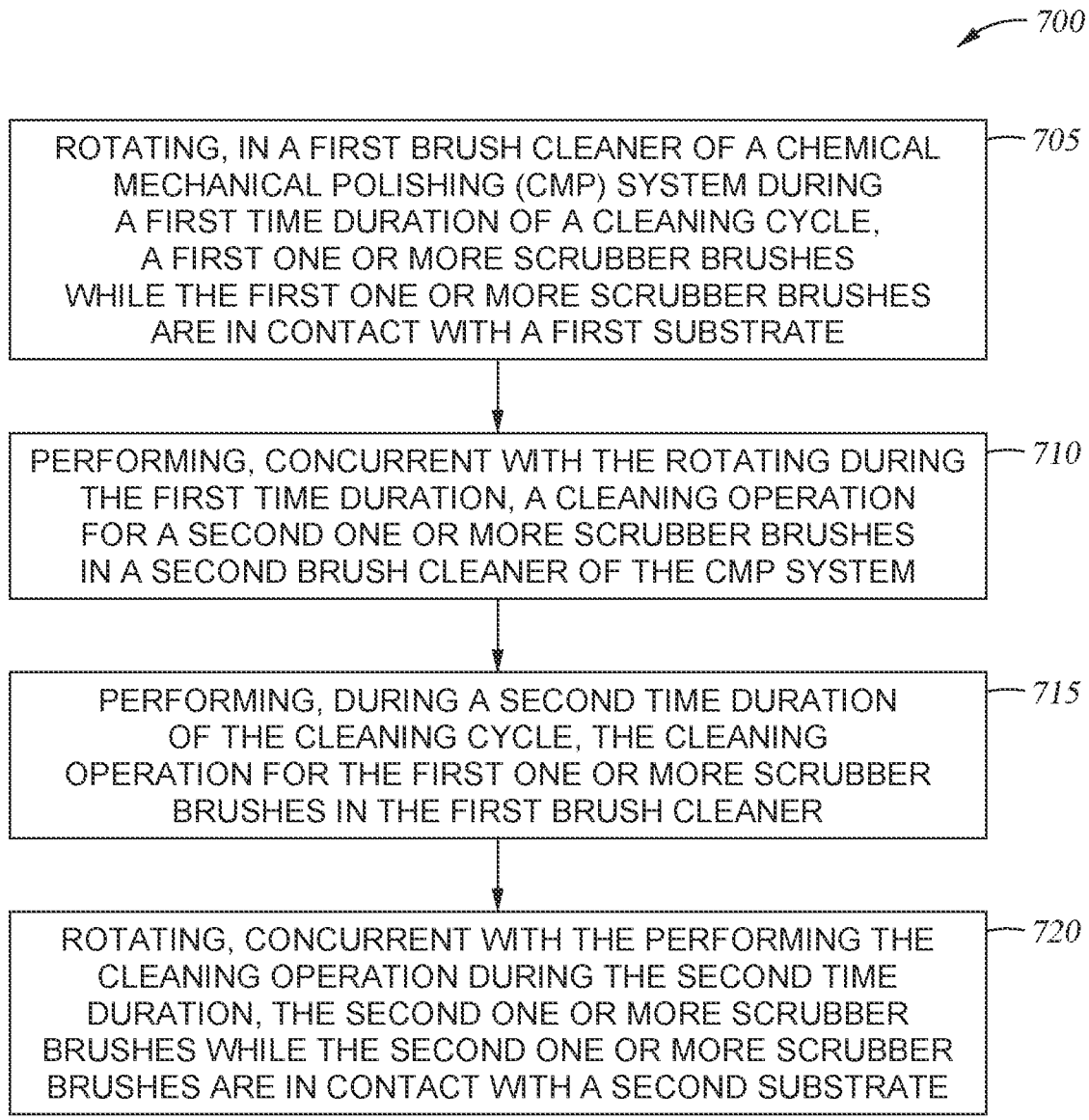
FIG. 7 is a diagram illustrating a method of operating a CMP system, according to certain embodiments.

FIG. 7 is a diagram illustrating a method 700 of operating a CMP system, according to certain embodiments. Note that CMP system 100 is described in the following example for illustrative purposes only.

Operation 705 includes rotating, in a first brush cleaner of the CMP system during a first time duration of a cleaning cycle, a first one or more scrubber brushes while the first one or more scrubber brushes are in contact with a first substrate. In one or more embodiments, the CMP system 100 may include the first brush cleaner 131 (e.g., brush cleaner 131a), the first one or more scrubber brushes may be examples of a pair of tubular covers 213a, 213b, and the first substrate may be an example of substrate 200.

Operation 710 includes performing, concurrent with the rotating during the first time duration, a cleaning operation for a second one or more scrubber brushes in a second brush cleaner of the CMP system. In one or more embodiments, the CMP system 100 may include the second brush cleaner 131 (e.g., brush cleaner 131b), the second one or more scrubber brushes may be examples of a pair of tubular covers 213a, 213b, and the second substrate may be an example of substrate 200.

Operation 715 includes performing, during a second time duration of the cleaning cycle, the cleaning operation for the first one or more scrubber brushes in the first brush cleaner.

Operation 720 includes rotating, concurrent with the performing the cleaning operation during the second time duration, the second one or more scrubber brushes while the second one or more scrubber brushes are in contact with a second substrate.

Additionally, in some embodiments of method 700, operations 705 and 710 are substantially performed concurrently (simultaneously), and operations 715 and 720 are substantially performed concurrently (simultaneously). In some embodiments of method 700, operation 705 is initiated before operation 710 is initiated. In some embodiments of method 700, operation 710 is initiated before operation 705 is initiated. In some embodiments of method 700, operation 715 is initiated before operation 720 is initiated. In some embodiments of method 700, operation 720 is initiated before operation 715 is initiated.

When introducing elements of the present disclosure or exemplary aspects or embodiment(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to embodiments of the present disclosure, other and further embodiments of the disclosure may be devised without departing from the basic scope thereof, and the scope thereof is determined by the claims that follow.

What is claimed is:

1. A chemical mechanical polishing (CMP) system, comprising:
   a first brush cleaner comprising:
      a first tank; and
      a first one or more scrubber brushes disposed in the first tank;
   a second brush cleaner comprising:
      a second tank; and
      a second one or more scrubber brushes disposed in the second tank; and
   a system controller that is configured to simultaneously control the first brush cleaner and the second brush cleaner to:
      rotate, during a first time duration of a cleaning cycle, the first one or more scrubber brushes while the first one or more scrubber brushes are in contact with a vertical first substrate disposed within the first tank and cause a substrate cleaning fluid from a supply pipe to be provided to the first substrate, the supply pipe configured to deliver the substrate cleaning fluid from a source to the first substrate;
      perform, concurrent with the rotating during the first time duration, a cleaning operation that comprises delivering a brush cleaning fluid from the supply pipe to of the second one or more scrubber brushes without a substrate disposed in the second tank, the supply pipe configured to receive the brush cleaning fluid from the source;
      perform, during a second time duration of the cleaning cycle, a cleaning operation that comprises delivering the brush cleaning fluid to the first one or more scrubber brushes without a substrate disposed in the first tank; and
      rotate, concurrent with the performing the cleaning operation during the second time duration, the second one or more scrubber brushes while the second one or more scrubber brushes are in contact with a vertical second substrate disposed in the second tank and cause the substrate cleaning fluid to be provided to the second substrate.

2. The CMP system of claim 1, further comprising:
   a third brush cleaner containing a third one or more scrubber brushes disposed in a third tank, wherein the system controller is further configured to rotate, in the third brush cleaner during the first time duration concurrent with the rotating and performing the cleaning operation during the first time duration, a third one or more scrubber brushes while the third one or more scrubber brushes are in contact with a third substrate disposed in the third tank and cause the substrate cleaning fluid to be provided to one or more surfaces of the third substrate.

3. The CMP system of claim 1, wherein the system controller is configured to:
   rotate, during a third time duration of the cleaning cycle, the first one or more scrubber brushes while the first one or more scrubber brushes are in contact with the first substrate or a fourth substrate; and
   rotate, during the third time duration, the second one or more scrubber brushes while the second one or more scrubber brushes are in contact with the second substrate or a fifth substrate.

4. The CMP system of claim 1, wherein the brush cleaning fluid comprises a different chemical composition from the substrate cleaning fluid, the brush cleaning fluid configured to clean and remove debris from first one or more scrubber surfaces of the scrubber brushes.

5. The CMP system of claim 1, wherein the system controller is configured to:
   rotate, concurrent with the rotating during the second time duration, the first one or more scrubber brushes while at least one conditioning bar is in contact with one or more scrubber brushes of the first one or more scrubber brushes.

6. A chemical mechanical polishing (CMP) system, comprising:
a first brush cleaner containing a first one or more scrubber brushes disposed in a first tank;
a second brush cleaner containing a second one or more scrubber brushes disposed in a second tank; and
a computer readable medium storing instructions that when executed by a processor of the CMP system, cause the CMP system to:
rotate, during a first time duration of a cleaning cycle, the first one or more scrubber brushes while the first one or more scrubber brushes are in contact with a first vertical substrate disposed in the first tank;
perform, concurrent with the rotating during the first time duration, a cleaning operation for the second one or more scrubber brushes without a substrate disposed in the second tank;
perform, during a second time duration of the cleaning cycle, the cleaning operation for the first one or more scrubber brushes without a substrate disposed in the first tank; and
rotate, concurrent with the performing the cleaning operation during the second time duration, the second one or more scrubber brushes while the second one or more scrubber brushes are in contact with a second vertical substrate disposed in the second tank.

7. The CMP system of claim 6, further comprising:
a third brush cleaner containing a third one or more scrubber brushes disposed in a third tank, wherein the instructions that when executed by the processor further cause the third one or more scrubber brushes to rotate, in the third brush cleaner during the first time duration concurrent with the rotating and performing the cleaning operation during the first time duration, the cleaning operation for a third one or more scrubber brushes while the third one or more scrubber brushes are in contact with a third substrate disposed in a third tank.

8. The CMP system of claim 6, wherein the instructions further cause the CMP system to:
rotate, in the first brush cleaner during a third time duration of the cleaning cycle, the first one or more scrubber brushes while the first one or more scrubber brushes are in contact with the first substrate or a fourth substrate; and
rotate, in the second brush cleaner during the third time duration, the second one or more scrubber brushes while the second one or more scrubber brushes are in contact with the second substrate or a fifth substrate.

9. The CMP system of claim 6, wherein the instructions further cause the CMP system to:
direct a substrate cleaning fluid to the first substrate while rotating the first one or more scrubber brushes during the first time duration; and
direct a brush cleaning fluid to the first one or more scrubber brushes during the second time duration when the one or more scrubber brushes are not in contact with a substrate.

10. The CMP system of claim 6, wherein the instructions further cause the CMP system to:
rotate, concurrent with the rotating during the second time duration, the first one or more scrubber brushes while at least one conditioning bar is in contact with one or more scrubber brushes of the first one or more scrubber brushes.

11. The CMP system of claim 1, wherein the source includes a substrate cleaning fluid source and a separate brush cleaning fluid source, wherein first brush cleaner and the second brush cleaner each further comprise:
a first set of spray nozzles configured to spray the substrate cleaning fluid from the substrate cleaning fluid source; and
a second set of spray nozzles configured to spray the brush cleaning fluid from the brush cleaning fluid source.

* * * * *